(12) United States Patent
Oh et al.

(10) Patent No.: US 11,940,932 B2
(45) Date of Patent: Mar. 26, 2024

(54) MEMORY DEVICE, STORAGE MODULE, HOST AND OPERATING METHODS FOR PERFORMING A REFRESH OPERATION BASED ON TEMPERATURE INFORMATION

(71) Applicant: SAMSUNG ELECTRONICS CO., LTD., Suwon-si (KR)

(72) Inventors: Doo Hwan Oh, Hwaseong-si (KR); Seung-Hun Lee, Hwaseong-si (KR); Jin Hun Jeong, Suwon-si (KR); Chang Ho Yun, Seoul (KR); Kyung-Hee Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 106 days.

(21) Appl. No.: 17/359,841

(22) Filed: Jun. 28, 2021

(65) Prior Publication Data

US 2022/0147277 A1 May 12, 2022

(30) Foreign Application Priority Data

Nov. 9, 2020 (KR) .................... 10-2020-0148331

(51) Int. Cl.
*G06F 13/16* (2006.01)
*G11C 11/406* (2006.01)

(52) U.S. Cl.
CPC .... *G06F 13/1636* (2013.01); *G11C 11/40626* (2013.01)

(58) Field of Classification Search
None
See application file for complete search history.

(56) References Cited

U.S. PATENT DOCUMENTS

| | | | |
|---|---|---|---|
| 7,206,244 B2 | 4/2007 | Cruz et al. | |
| 7,489,579 B2 | 2/2009 | Ho | |
| 7,543,106 B2 | 6/2009 | Choi | |
| 8,797,779 B2 | 8/2014 | Rajan et al. | |
| 9,230,635 B1 | 1/2016 | Wang et al. | |
| 9,442,816 B2 | 9/2016 | Cordero et al. | |
| 9,767,883 B2 * | 9/2017 | Doo ................ | G11C 11/40626 |
| 9,905,285 B2 | 2/2018 | Cho et al. | |

(Continued)

FOREIGN PATENT DOCUMENTS

| KR | 10-2017-0020607 A | 2/2017 |
|---|---|---|
| WO | WO-2021147043 A1 * | 7/2021 |

OTHER PUBLICATIONS

Jedec. "DDR4 SDRAM." Sep. 2012. JESD79-4.*

(Continued)

*Primary Examiner* — Nathan Sadler
(74) *Attorney, Agent, or Firm* — Sughrue Mion, PLLC

(57) ABSTRACT

Provided is an operating method of a storage device. The method includes providing temperature information of each of a plurality of volatile memory devices in the storage device to a host device; and receiving a setting command related to a refresh operation of the plurality of volatile memory devices from the host device, wherein the plurality of volatile memory devices are classified into groups based on temperature information, and wherein the setting command indicates a number of rows of the plurality of volatile memory devices to be refreshed differently for each of the groups based on the temperature information.

26 Claims, 12 Drawing Sheets

(56) References Cited

U.S. PATENT DOCUMENTS

| | | | |
|---|---|---|---|
| 10,042,401 B2 | 8/2018 | Wyatt | |
| 2002/0191467 A1* | 12/2002 | Matsumoto | G11C 11/406 365/222 |
| 2006/0085616 A1* | 4/2006 | Zeighami | G11C 11/40611 711/167 |
| 2011/0205826 A1* | 8/2011 | Kuroda | G11C 11/40626 365/222 |
| 2013/0279283 A1* | 10/2013 | Seo | G11C 7/00 365/222 |
| 2014/0369110 A1* | 12/2014 | Cho | G11C 11/40626 365/222 |
| 2014/0371945 A1* | 12/2014 | Sato | G11C 11/40611 700/299 |
| 2016/0064063 A1* | 3/2016 | Nomura | G11C 11/40618 365/189.011 |
| 2016/0300816 A1* | 10/2016 | Park | H01L 25/0657 |
| 2019/0026028 A1* | 1/2019 | Chun | G11C 11/40626 |
| 2020/0027500 A1* | 1/2020 | Heymann | G01K 13/00 |
| 2020/0143847 A1 | 5/2020 | Yuan et al. | |

OTHER PUBLICATIONS

Jacob et al. Memory Systems: Cache, DRAM, Disk. 2008. Elsevier. pp. 409-413.*
Translation of WO-2021147043-A1. 2023.*

* cited by examiner

MEMORY DEVICE, STORAGE MODULE, HOST AND OPERATING METHODS FOR PERFORMING A REFRESH OPERATION BASED ON TEMPERATURE INFORMATION

CROSS-REFERENCE TO RELATED APPLICATION

This application is based on and claims priority under 35 U.S.C. § 119 from Korean Patent Application No. 10-2020-0148331 filed on Nov. 9, 2020 in the Korean Intellectual Property Office, the disclosure of which is incorporated herein by reference in its entirety.

BACKGROUND

1. Technical Field

The disclosure relates to a memory device, a storage device, a host, and operating methods thereof.

2. Description of the Related Art

A volatile memory device, for example, a dynamic RAM (DRAM) device stores data in a cell capacitor. Data is stored in the form of electric charge in the cell capacitor, and the electric charge stored in the cell capacitor is lost over time. Accordingly, before the electric charge stored in the cell capacitor is completely lost, a refresh operation of sensing and rewriting data is required.

However, since the amount of electric charge lost increases as the temperature of the DRAM cell increases, the refresh period of the DRAM cell must be shortened. In addition, when the DRAM cell is in the refresh operation, data write/read operations may not be performed, and the amount of power consumed by the refresh operation is large. Accordingly, when the refresh period is shortened and the refresh operations are frequently performed, the time for the host to write/read data decreases and system performance deteriorates. In addition, frequent refresh operations increase the overall power consumption of the DRAM device.

Meanwhile, a DRAM module (e.g., a dual in-line memory module (DIMM)) includes a plurality of DRAM devices disposed on a module substrate. Depending on the installation location (installation direction) of the DRAM module in the system (e.g., server), the temperatures of the plurality of DRAM devices of the DRAM module may be different from each other. For example, a DRAM device that is directly affected by the air flow generated by a fan cools more easily than a DRAM device that is not. Although the temperature of each of the plurality of DRAM devices is different as described above, the host refreshes all of the plurality of DRAM devices in the same manner.

SUMMARY

Aspects of the disclosure provide a semiconductor device, an operating method thereof, a storage device, an operating method thereof, a host, and an operating method thereof in which a refresh rate is adjusted according to temperature to minimize power consumption.

However, aspects of the disclosure are not restricted to one set forth herein. The above and other aspects of the disclosure will become more apparent to one of ordinary skill in the art to which the disclosure pertains by referencing the detailed description of the present disclosure given below.

According to an aspect of the disclosure, there is provided an operating method of a storage device, comprising: providing temperature information of each of a plurality of volatile memory devices in the storage device to a host device; and receiving a setting command related to a refresh operation of the plurality of volatile memory devices from the host device, wherein the plurality of volatile memory devices are classified into groups based on temperature information, and wherein the setting command indicates a number of rows of the plurality of volatile memory devices to be refreshed differently for each of the groups based on the temperature information.

According to another aspect of the disclosure, there is provided an operating method of a host device, comprising: receiving temperature information of each of a plurality of volatile memory devices of a storage device; classifying the plurality of volatile memory devices into a plurality of groups based on the temperature information of each of the plurality of volatile memory devices; and providing a setting command corresponding to a refresh operation of the plurality of volatile memory devices to the storage device, wherein the setting command indicates a number of rows of the plurality of volatile memory devices to be refreshed differently for each of the plurality of groups based on the temperature information.

According to another aspect of the disclosure, there is provided a storage device comprising: a plurality of first volatile memory devices, each of the plurality of first volatile memory devices having a temperature within a first temperature range; a plurality of second volatile memory devices, each of the plurality of second volatile memory devices having a temperature within a second temperature range different from the first temperature range; and a controller configured to refresh a first number of rows in the plurality of first volatile memory devices according to a first refresh command from a host device, and refresh a second number of rows different from the first number of rows, in the plurality of second volatile memory devices according to a second refresh command from the host device.

According to another aspect of the disclosure, there is provided a system comprising: a fan configured to generate an air flow; and a storage device cooled by the air flow of the fan, wherein the storage device includes: a device substrate; a plurality of first volatile memory devices disposed on a first side of the device substrate; a plurality of second volatile memory devices disposed on a second side of the device substrate; and a controller configured to refresh a first number of rows in the plurality of first volatile memory devices according to a first refresh command from a host device, and refresh a second number of rows different from the first number of rows, in the plurality of second volatile memory devices according to a second refresh command from the host device.

According to another aspect of the disclosure, there is provided a semiconductor device comprising: a plurality of volatile memory cells arranged in a plurality of rows, wherein a first number of rows are refreshed according to a first refresh command from a host device when a temperature of the semiconductor device is within a first temperature range, and wherein a second number of rows different from the first number of rows are refreshed according to a second refresh command from the host device when the temperature of the semiconductor device is within a second temperature range.

According to another aspect of the disclosure, there is provided an operating method of a storage device, comprising: receiving a setting command including a first bit corresponding to a temperature range and a second bit indicating a refresh rate corresponding to the temperature range when all banks are in an idle state; adjusting a number of rows of a volatile memory device to be refreshed based on a refresh command of a host device according to the refresh rate during an update delay time; and after the update delay time has elapsed, receiving a non-setting command.

BRIEF DESCRIPTION OF THE DRAWINGS

The above and other aspects and features of the disclosure will become more apparent by describing in detail exemplary embodiments thereof with reference to the attached drawings, in which.

DETAILED DESCRIPTION OF THE EMBODIMENTS

Hereinafter, various embodiments of the disclosure will be described with reference to the accompanying drawings.

Figure 1:
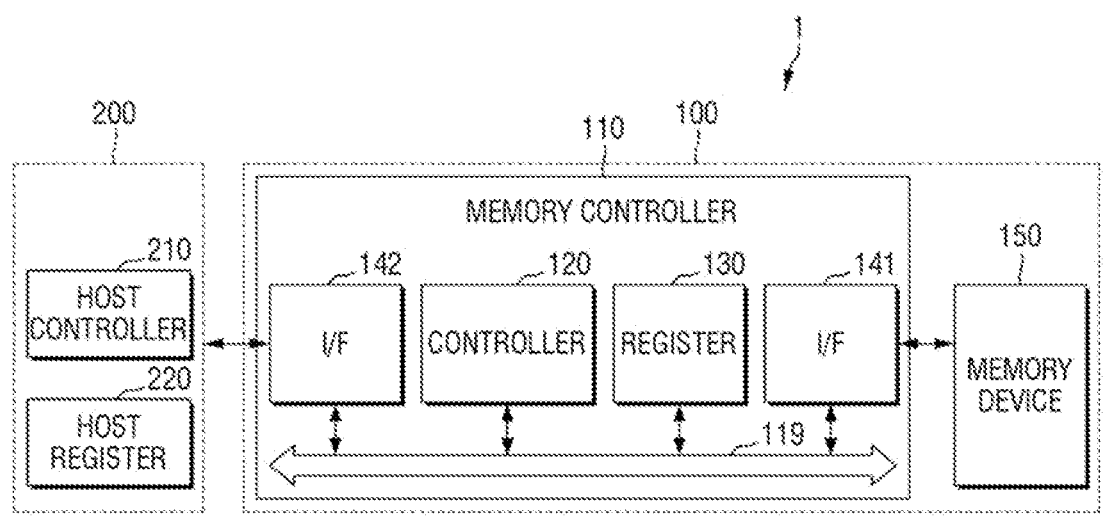
FIG. 1 is a block diagram illustrating a system according to some embodiments of the disclosure.
Figure 2:
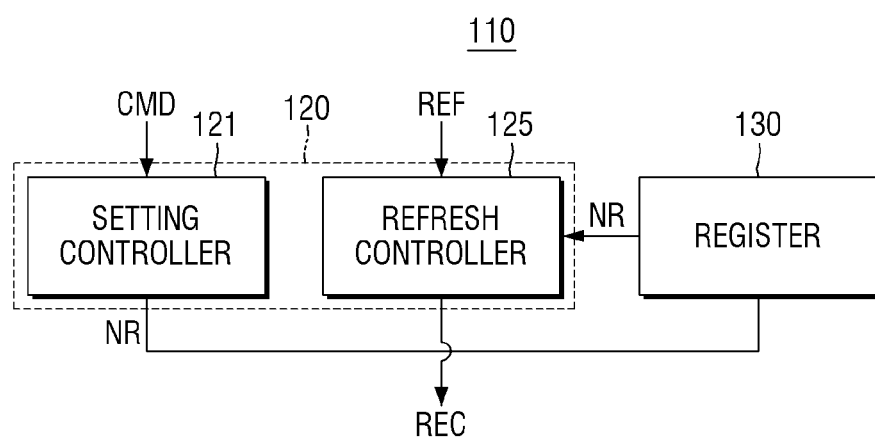
FIG. 2 is a block diagram illustrating a storage device of FIG. 1.

FIG. 1 is a block diagram illustrating a system 1 according to some example embodiments of the disclosure. FIG. 2 is a block diagram illustrating a storage device 100 of FIG. 1. According to an example embodiment, the system 1 may be a host-storage device system.

According to an example embodiment, system 1 of FIG. 1 may be a mobile system such as a portable communication terminal, mobile phone, a smart phone, a tablet personal computer, a wearable device, a healthcare device, or an Internet of Things (IoT) device. However, the system 1 is not limited to a mobile system, and may also be a personal computer, a laptop computer, a server, a media player, an automotive device such as a navigation system, or the like.

Referring to FIG. 1, a storage device 100 may communicate with a host 200 and write or read data based on a request of the host 200. According to an example embodiment, the storage device 100 may write or read data in response to a request from the host 200.

In addition, the storage device 100 may control a refresh operation according to the request of the host 200. The host 200 may be a host device, which includes a host controller 210, a host register 220, or the like. As described in detail below, the host controller 210 may calculate a refresh rate related to the refresh operation of a memory device 150 based on temperature information of the memory device 150. The host register 220 may temporarily store the calculated refresh rate. The host register 220 may store information related to a refresh interval time tREFi calculated based on the refresh rate.

The storage device 100 includes a memory controller 110 and the memory device 150 that stores data under the control of the memory controller 110.

The memory controller 110 may include a memory interface 141, a host interface 142, a controller 120, and a register 130 connected to each other through a bus 119. The controller 120 communicates with the host 200 through the host interface 142 and controls the memory device 150 through the memory interface 141.

The host interface 142 provides a connection for exchanging data with the host 200, and may include various types of interfaces, such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (eMMC), universal flash storage (UFS), embedded universal flash storage (eUFS), and compact flash (CF) card. The memory interface 141 may be implemented to conform to standard conventions such as Toggle or ONFI.

The register 130 may store refresh-related information. For example, the refresh rate transmitted from the host 200 may be stored. In addition, the number of rows of the memory device 150 to be refreshed per refresh command of the host 200 corresponding to the refresh rate may be stored. In addition, a refresh progress time tRFC corresponding to the refresh rate may be stored.

The memory device 150 is a volatile memory device, and may be, for example, a dynamic RAM (DRAM), but is not limited thereto.

The storage device 100 may be physically separated from the host 200 or may be implemented in a same package as the host 200.

Referring to FIG. 2, the controller 120 may include a setting controller 121 and a refresh controller 125. According to an example embodiment, the setting controller may be a Mode Register Set (MRS) controller.

The setting controller 121 may receive a setting command CMD related to a refresh operation from the host 200 and decode the command to recognize the refresh rate. The setting controller 121 may use the refresh rate to calculate the number NR of rows of the memory device 150 to be refreshed per refresh command REF. The number NR of rows is stored in the register 130.

According to an example embodiment, the setting command CMD may be in any form as long as the command is a signal for setting a mode register related to the refresh operation. For example, the setting command CMD may be a mode register set (MRS) command in DDR4 or a mode register write (MRW) command in DDR5. The refresh rate adjustment using the MRS command and the MRW command (i.e., setting the number NR of rows of the memory device 150 to be refreshed per refresh command REF) will be described in detail later.

The refresh controller 125 receives the refresh command REF from the host 200 and outputs a control signal REC that controls the refresh operation of the memory device 150 based on the number NR of rows stored in the register 130. The refresh controller 125 may count the rows on which the refresh is performed, and may terminate the refresh when the counted number reaches the preset number NR of rows.

Figure 3:
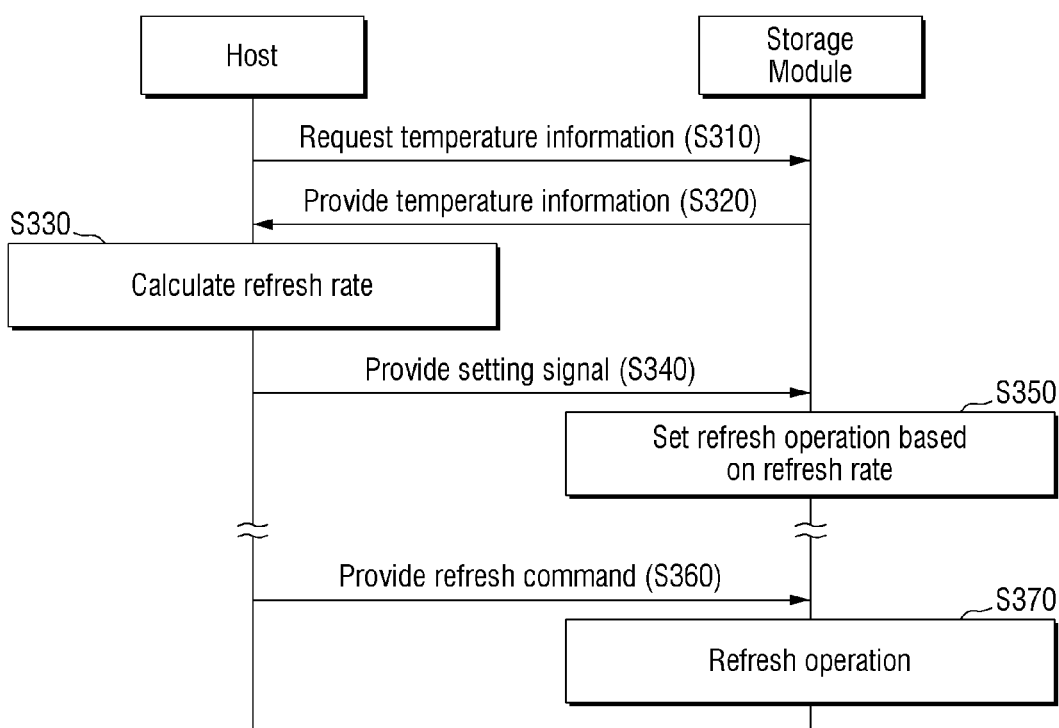
FIG. 3 is a diagram illustrating an operating method of a system according to some embodiments of the disclosure.
Figure 4:
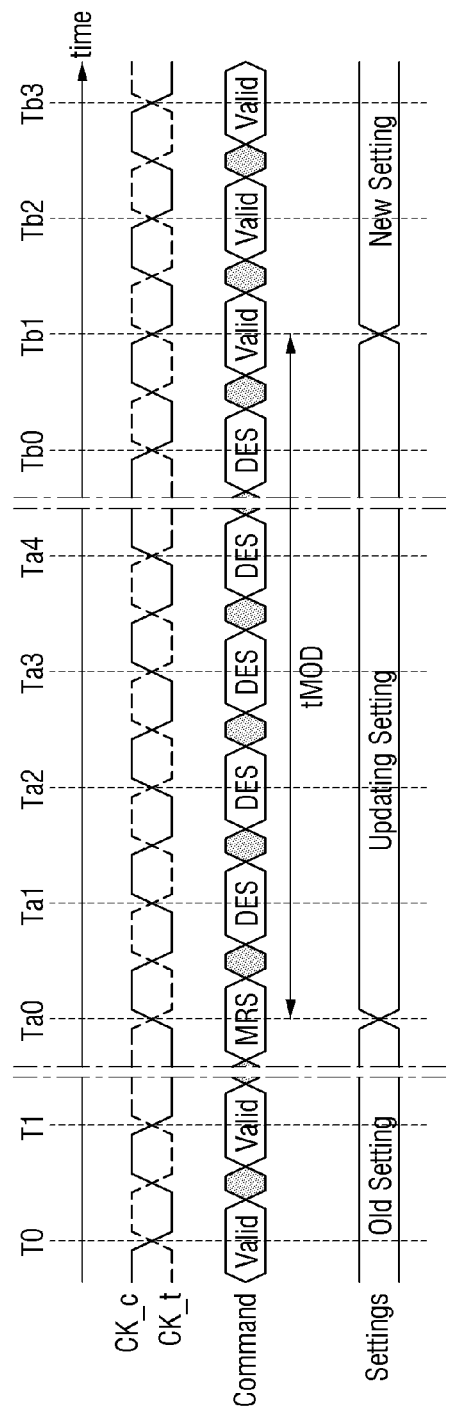
FIG. 4 is a timing diagram illustrating a step S340 of providing a setting command and a step S350 of setting a refresh operation of FIG. 3.

Referring to FIGS. 3 and 4, the refresh rate adjustment using the MRS command and the MRW command will be described.

FIG. 3 is a diagram illustrating an operating method of a system (host-storage device system) according to some example embodiments of the disclosure. FIG. 4 is a timing diagram illustrating a step S340 of providing a setting command and a step S350 of setting a refresh operation of FIG. 3.

Referring to FIG. 3, in operation S310, the host 200 requests temperature information from the storage device 100.

Subsequently, in operation S320, the host 200 receives temperature information from the storage device 100. The temperature information may be temperature information measured by a temperature sensor of the volatile memory device 150 included in the storage device 100.

Thereafter, in operation S330, the host 200 calculates a refresh rate based on the temperature information.

Specifically, the host 200 may check which temperature range the temperature information belongs to. The host 200 may use a table including a plurality of temperature ranges and refresh rates corresponding to the temperature ranges. The table may have a first temperature range (e.g., 21 to 40° C.), a second temperature range (e.g., 41 to 70° C.), a third temperature range (e.g., 71 to 90° C.), and a fourth temperature range (e.g., 91 to 120° C.), and the first temperature range may correspond to the refresh rate of 0.5 times, the second temperature range may correspond to the refresh rate of 0.75 times, the third temperature range may correspond to the refresh rate of 1 times, and the fourth temperature range may correspond to the refresh rate of 1.25 times. For example, when the temperature information of the volatile memory device 150 is 50° C., it corresponds to the second temperature range and is calculated as the refresh rate of 0.75 times.

Alternatively, the host 200 may calculate the refresh rate using an equation or a formula with the temperature information as an input. For example, a formula f(x) may apply f(x)=0.5 when x<20, f(x)=0.5+(x−20)×(1/120) when 20≤x<120, and f(x)=1.4 when x≥120, according to temperature information x of the volatile memory device 150. For example, when the temperature information of the volatile memory device 150 is 80° C., it corresponds to 20≤x<120, and according to the preset formula, the refresh rate is 1 times ('·' f(80)=0.5+(80−20)×(1/120)=1). Alternatively, when the temperature information of the volatile memory device 150 is 130° C., it corresponds to x≥120 and the refresh rate is 1.4 times.

The refresh rate calculated in this way may be stored in a register such as the host register 220 in FIG. 1.

In operation S340, the host 200 provides a setting command to the storage device 100.

As described above, the setting command may be a mode register set (MRS) command of DDR4 or a mode register write (MRW) command of DDR5. The setting command may include a bit indicating the calculated refresh rate. Alternatively, the setting command may include both of a bit indicating the calculated temperature range and a bit indicating a refresh rate corresponding to the calculated temperature range.

When the setting command is the MRS command of DDR4, the logical values of each of the signals (CKE, CS_n, RAS_n, CAS_n, WE_n, BG0-BG1, BA0-BA1, C2-C0, A12, A17, A14, A11, A10, A0-A9, or the like) of the MRS command, are illustrated in Table 1. Here, H is high, L is low, BG is a bank group address, BA is a bank address, X means that it may be defined as H or L or may not be defined such as floating (i.e., don't care), and V indicates a logic level defined as H or L. In particular, OP code means an operating code.

TABLE 1

| | Function | | | | | | |
|---|---|---|---|---|---|---|---|
| | CKE | | | | | | |
| | Previous cycle | Current cycle | CS_n | ACT_n | RAS_n/ A16 | CAS_n/ A15 | WE_n/ A14 |
| MRS | H BG0-BG1 BG | H BA0-BA1 BA | L C2-C0 V | H A12/ BC_n | L A17, A14, A11 | L A10/AP OP code | L A0-A9 |

Alternatively, when the setting command is an MRW command of DDR5, the logical values of each of the signals (CS_n and CA0 to CA13) of the MRW command are illustrated in Table 2. Here, H is high, L is low, MRA0 to MRA7 are mode register addresses, and V is a logic level defined as H or L. In particular, OP0 to OP7 means an operating code.

TABLE 2

| | | Function | | | | | | |
|---|---|---|---|---|---|---|---|---|
| | CS_n | CA0 | CA1 | CA2 | CA3 | CA4 | CA5 | CA6 |
| MRW | L | H CA7 MRA2 | L CA8 MRA3 | H CA9 MRA4 | L CA10 MRA5 | L CA11 MRA6 | MRA0 CA12 MRA7 | MRA1 CA13 V |
| | CS_n H | CA0 OP0 CA7 OP7 | CA1 OP1 CA8 V | CA2 OP2 CA9 V | CA3 OP3 CA10 CW | CA4 OP4 CA11 V | CA5 OP5 CA12 V | CA6 OP6 CA13 V |

Referring to Tables 1 and 2, refresh-related information may be displayed by using the operating code (OP code) of the MRS command of DDR4 or the operating code (OP0 to OP7) of the MRW command of DDR5.

Refresh-related information in the setting command is illustrated in Table 3, for example. Referring to Table 3, the operating code may be, for example, 8 bits (OP[7:0]).

OP[2:0] indicates the temperature range. According to the data (000 to 111) described in OP[2:0], the corresponding temperature range may be different.

OP[5:3] indicates the refresh rate. According to the data (000 to 111) described in OP[5:3], the corresponding refresh rate may be different. For example, some data (e.g., 000 and 001) of OP[5:3] are designated to indicate the same refresh rate, but are not limited thereto. Unlike that described in Table 3, the refresh rate corresponding to all data (000 to 111) may be different.

OP[6] corresponds to an RFU (i.e., a function has not been assigned yet). If necessary, OP[6] may be assigned a separate function.

OP[7] designates a refresh control mode (RCM) and indicates whether to use the function to control the refresh rate according to temperature. That is, it indicates whether to use a function of differently setting the number of rows of the volatile memory device according to temperature.

In addition, in the register type in Table 3, R means that only read is possible, and R/W means that read and write are possible.

In Table 3, the temperature range is indicated by 3 bits and the refresh rate is indicated by 3 bits, but the disclosure is not limited thereto.

TABLE 3

| Function | Register type | Operand | Data |
|---|---|---|---|
| Temperature Range | R | OP[2:0] | 000: less than 0° C. |
| | | | 001: 0~20° C. |
| | | | 010: 21~40° C. |
| | | | 011: 41~60° C. |
| | | | 100: 61~70° C. |
| | | | 101: 71~85° C. |
| | | | 110: 85~95° C. |
| | | | 111: more than 95° C. |
| Refresh Rate | R/W | OP[5:3] | 000: 0.25× Refresh Rate |
| | | | 001: 0.25× Refresh Rate |
| | | | 010: 0.5× Refresh Rate |
| | | | 011: 0.5× Refresh Rate |
| | | | 100: 1× Refresh Rate |
| | | | 101: 1× Refresh Rate |
| | | | 110: 2× Refresh Rate |
| | | | 111: 2× Refresh Rate |
| RFU | RFU | OP[6] | RFU |
| Refresh Control Mode | R/W | OP[7] | 0: disabled |
| | | | 1: enabled |

In operation S350, the storage device 100 sets a refresh operation based on the refresh rate.

Specifically, the storage device 100 checks the refresh rate by decoding the provided setting command. The storage device 100 may set a refresh operation based on a refresh rate. The storage device 100 may use the refresh rate to set the number of rows of the volatile memory device 150 to be refreshed corresponding to the refresh command, or to set the refresh progress time tRFC.

According to an example embodiment, when the refresh rate is A, the number of rows to be refreshed per refresh command when A=1 is taken as a reference row number R_a, and the refresh progress time when A=1, is taken as a reference refresh progress time tRFC_a. The refresh progress time of the volatile memory device requiring resetting of the refresh operation may be calculated as tRFC_a×A. In addition, the number of rows to be refreshed per refresh command according to the refresh rate is calculated as R_a×A.

Meanwhile, the host 200 may also reset the refresh operation based on the refresh rate. The host 200 may adjust the refresh interval time tREFi using the refresh rate. For example, when the refresh interval time when A=1 is referred to as the reference refresh interval time tREFi_a, the refresh interval time of the volatile memory device requiring resetting of the refresh operation is calculated as tREFi_a/A. The host 200 provides a refresh command to the storage device 100 in accordance with the calculated refresh interval time.

For example, in Table 4, when the refresh rate is 1, it may be that R_a=256, tREFi_a=7.8 μs, and tRFC_a=350 ns. Specifically, when the refresh rate is 1, the host 200 may provide 8,192 refresh commands to the storage device 100 for 64 ms ('·' tREFi_a=7.8 μs (=64/8,192)). In addition, in the case of an 8 Gb product, 1 Mb (=8 Gb/8,192) is refreshed per refresh command. At this time, the required refresh progress time is 350 ns.

When the refresh rate is 0.5, the number of rows to be refreshed per refresh command is 128 (=256×0.5), the refresh interval time is 15.6 μs (=7.8/0.5), and the refresh progress time is 175 ns (=350×0.5).

When the refresh rate is 1.2, the number of rows to be refreshed per refresh command is 308 (=256×1.2), the refresh interval time tREFi is 6.5 μs (=7.8/1.2), and the refresh progress time tRFC is 420 ns (=350×1.2).

TABLE 4

| Refresh Rate | Number of rows/ Refresh Command (unit: number) | tREFi (unit: μs) | tRFC (unit: ns) |
|---|---|---|---|
| 1.2 | 308 | 6.5 | 420 |
| 1 | 256 | 7.8 | 350 |
| 0.75 | 192 | 10.4 | 263 |
| 0.5 | 128 | 15.6 | 175 |

In operation S360, the host 200 provides a refresh command to the storage device 100 and in operation S370, the storage device 100 performs a refresh operation in the manner that has been reset.

Referring to FIG. 4, a process of setting the mode register of DDR4 will be described.

In FIG. 4, times T0 to Ta0 are in an old setting state. For instance, the times T0 to Ta0 are in a previous setting state.

At the time Ta0, the host 200 provides the setting command CMD to the storage device 100. In DDR4, when all banks are in an idle state, the host 200 may provide the setting command CMD to the storage device 100.

Between times Ta0 and Tb1, the host 200 may not provide a non-setting command. Here, the non-setting command may refer a command other than the setting command CMD, for example, an active/read/write command, or the like. These times Ta0 to Tb1 are referred to as an update delay time tMOD. During the update delay time tMOD, the storage device 100 decodes the setting command CMD to check refresh-related information (e.g., a refresh rate, a corresponding temperature range, or the like), and resets the refresh operation based on the refresh-related information.

After the time Tb1 (i.e., after the update delay time tMOD has elapsed), the storage device 100 may receive a non-setting command, i.e., a command other than the setting command CMD.

According to an example embodiment, the process of setting the mode register of DDR5 may be similar to the process of setting the mode register of DDR4. During the normal operation, when all banks are in an idle state, the host 200 provides the setting command CMD to the storage device 100. The host 200 may not provide a non-setting command to the storage device 100 during the update delay time tMRD. During the update delay time tMRD, the storage device 100 resets the refresh operation. After the update delay time tMRD has elapsed, the storage device 100 receives a non-setting command.

Meanwhile, according to an example embodiment, whether the refresh operation has been reset may be confirmed by measuring an amount of current as illustrated in Table 5. For instance, when at least some of the current amounts illustrated in Table 5 change as the temperature changes, it may be seen or determined that the refresh operation has been reset. Since the meanings of the current amounts in Table 5 are disclosed in the specification of DDR5 or DDR4, detailed descriptions thereof will be omitted herein. For example, IDD5B may be the burst refresh current (1×REF), IPP5B may be the burst refresh write IPP current (1×REF), IDD6A may be the auto self-refresh current, and IPP6A may be an auto self-refresh IPP current.

TABLE 5

| Protocol | Current Amount |
| --- | --- |
| DDR5 | IDD5B, IDDQ5B, IPP5B, IDD5F, IDDQ5F, IPP5F, IDD5C, IDDQ5C, IPP5C, IDD6N, IDDQ6N, IPP6N, IDD6E, IDDQ6E, IPP6E |
| DDR4 | IDD5B, IPP5B, IPP5F2, IDD5F4, IPP5F4, IDD6N, IPP6N, IDD6E, IPP6E, IDD6R, IPP6R, IDD6A, IPP6A |

Figure 5:
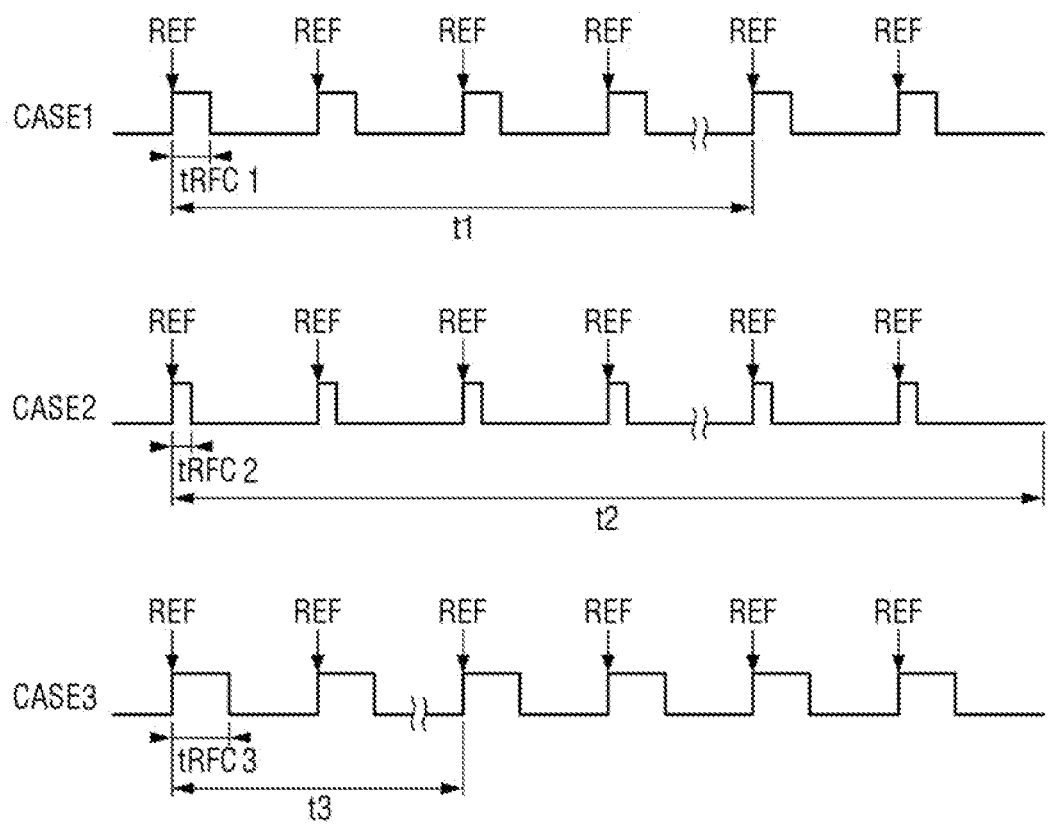
FIGS. 5 to 7 are timing diagrams explaining a refresh operation of a storage device according to some embodiments of the disclosure.
Figure 6:
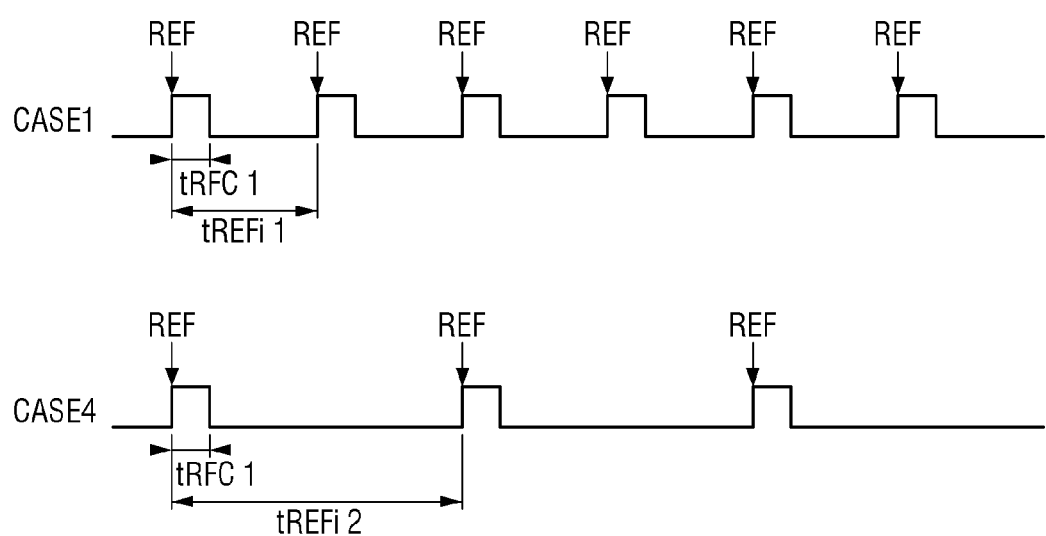
Figure 7:
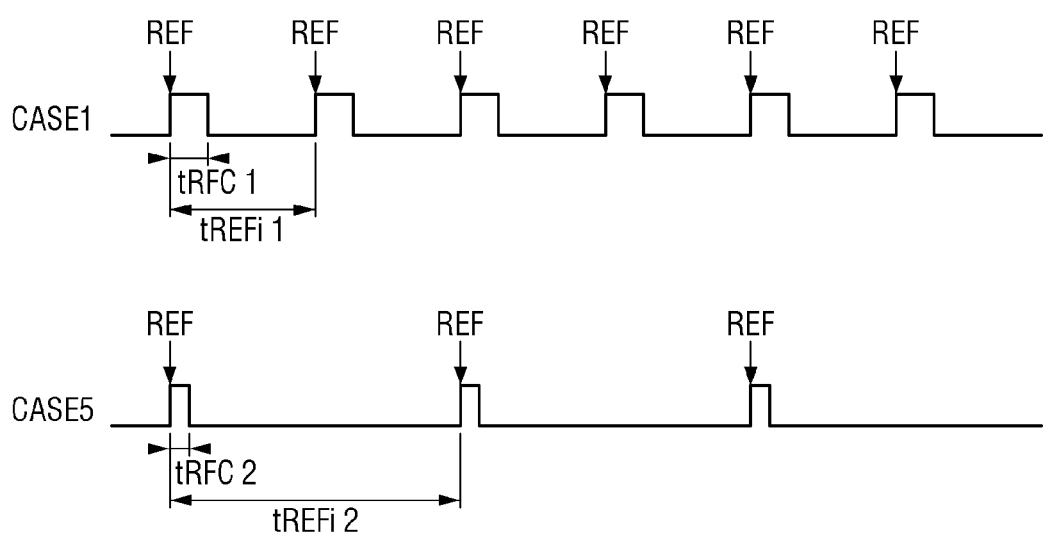

FIGS. 5 to 7 are timing diagrams explaining a refresh operation of a storage device according to some example embodiments of the disclosure.

FIG. 5 illustrates adjusting the number of rows to be refreshed per refresh command or the refresh progress time tRFC, based on the refresh rate. Here, CASE 1 is a case where the refresh rate A is 1, CASE 2 is a case where the refresh rate A is less than 1, and CASE 3 is a case where the refresh rate A is greater than 1.

According to an example embodiment illustrated in CASE1, each time the refresh command REF is input, a time during which one row of the volatile memory device is refreshed (i.e., a refresh progress time) proceeds during tRFC1. The time during which all the rows of the volatile memory device are refreshed (i.e., the total refresh time) is t1.

According to an example embodiment illustrated in CASE2, the tRFC2, which is the time during which one row is refreshed, is shortened compared to tRFC1 of CASE 1. That is, the number of rows to be refreshed per refresh command of CASE 2 is decreased compared to that of CASE 1. Accordingly, t2, which is the time during which all rows of the volatile memory device are refreshed, is longer than t1 of CASE 1. In case of CASE 2, since tRFC2 is short, the system performance is improved because there is a sufficient time to write/read.

According to an example embodiment illustrated in CASE2, the tRFC3, which is the time during which one row is refreshed, is longer than tRFC1 of CASE 1. That is, the number of rows to be refreshed per refresh command of CASE 3 is increased compared to that of CASE 1. Accordingly, t3, which is the time during which all rows of the volatile memory device are refreshed, is shortened compared to t1 of CASE 1.

FIG. 6 illustrates adjusting the refresh interval time tREFi based on the refresh rate. The following description will focus on differences from the description with reference to FIG. 5.

Referring to FIG. 6, each time the refresh command REF is inputted in CASE 1, the refresh progress time is tRFC1, and the refresh interval time is tRFEi1.

According to an example embodiment illustrated in CASE4 where the refresh rate A is less than 1, the tRFEi2, which is the refresh interval time, is lengthened compared to tRFEi1 of CASE1. Accordingly, since the time until the next refresh starts is sufficient, the time to write/read increases, so that system performance is improved.

FIG. 7 illustrates adjusting all of the refresh interval time tREFi and the refresh progress time tRFC or the number of rows to be refreshed per refresh command, based on the refresh rate. The following description will focus on differences from the description with reference to FIGS. 5 and 6.

According to an example embodiment illustrated in CASE5, where the refresh rate A is less than 1, the tRFC2, which is the time during which one row is refreshed, is shortened compared to tRFC1 of CASE 1. That is, the number of rows to be refreshed per refresh command of CASE 5 is decreased compared to that of CASE 1. Further, tRFEi2, which is the refresh interval time, is lengthened compared to tRFEi1 of CASE1. In case of CASE 5, since tRFC2 is shortened and the time until the next refresh starts is sufficient, the system performance is improved because there is a sufficient time to write/read.

Figure 8:
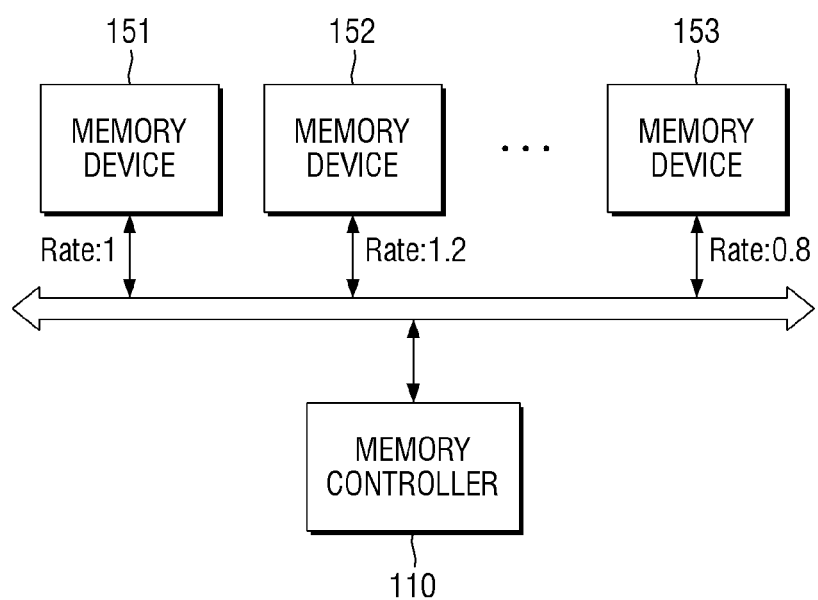
FIG. 8 is a block diagram illustrating a storage device according to one embodiment of the disclosure.

FIG. 8 is a block diagram illustrating a storage device according to an example embodiment of the disclosure.

Referring to FIG. 8, the storage device 100 includes the memory controller 110, and a plurality of volatile memory devices 151, 152, and 153, connected to each other through a bus.

According to an example embodiment, temperatures of the plurality of volatile memory devices 151, 152, and 153 may belong to different temperature ranges. Accordingly, the plurality of volatile memory devices 151, 152, and 153 may correspond to different refresh rates. For example, the refresh rate of the volatile memory device 151 may be 1, the refresh rate of the volatile memory device 152 may be 1.2, and the refresh rate of the volatile memory device 153 may be 0.8. Accordingly, each of the plurality of volatile memory devices 151, 152, and 153 may have different numbers of rows to be refreshed per refresh command, from each other. Alternatively, each of the plurality of volatile memory devices 151, 152, and 153 may have different refresh interval times from each other.

Figure 9:
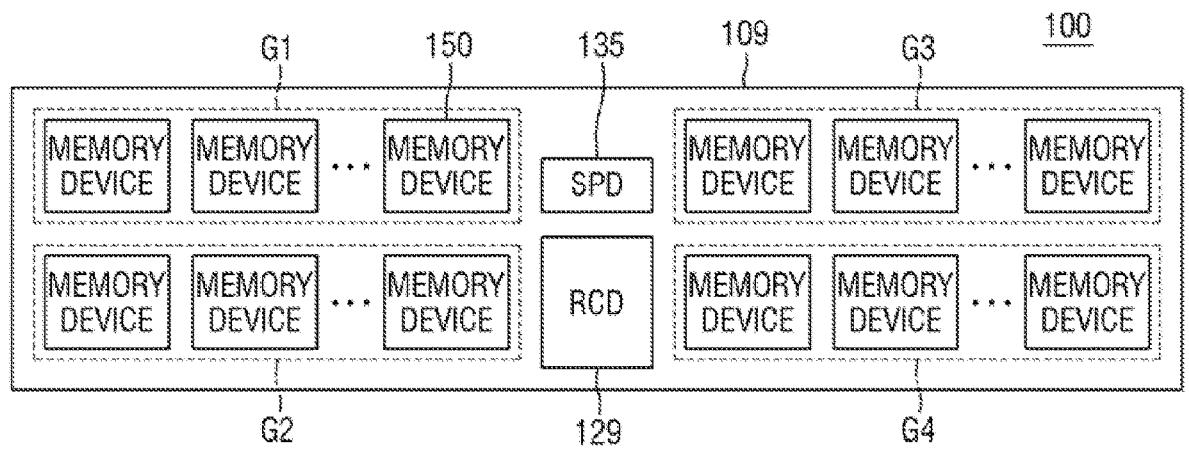
FIG. 9 is a diagram illustrating a storage device according to another embodiment of the disclosure.

FIG. 9 is a diagram illustrating a storage device according to another example embodiment of the disclosure.

Referring to FIG. 9, the storage device may include a board 109, a register clock driver (RCD) 129, a serial presence detect (SPD) 135, and a plurality of volatile memory devices 150 provided on the board 109.

The RCD 129 may receive commands, addresses, and clocks from a host, and control the plurality of volatile memory devices 150.

The SPD 135 is a space for storing various types of information of a storage device, and may be a nonvolatile memory (e.g., EERPOM). A temperature sensor for measuring the device temperature is installed in the SPD 135, and the SPD 135 may periodically provide the device temperature to the host.

The plurality of volatile memory devices 150 may receive data from a host (without passing through the RCD 129). According to an example embodiment, a data buffer is installed on the device board 109. After data provided from the host is temporarily stored in the data buffer, the data may be transferred to the plurality of volatile memory devices 150.

Here, the plurality of volatile memory devices 150 may be divided into a plurality of groups G1 to G4. Each of the groups G1 to G4 may correspond to a different refresh rate from each other. A refresh rate of one group (e.g., G1) may be 0.5, and a refresh rate of another group (e.g., G4) may be 1. Accordingly, the number of rows to be refreshed per refresh command of the group G1 may be smaller than that of the group G4. Alternatively, the refresh interval time tREF of the group G1 may be longer than that of the group G4.

Figure 10:
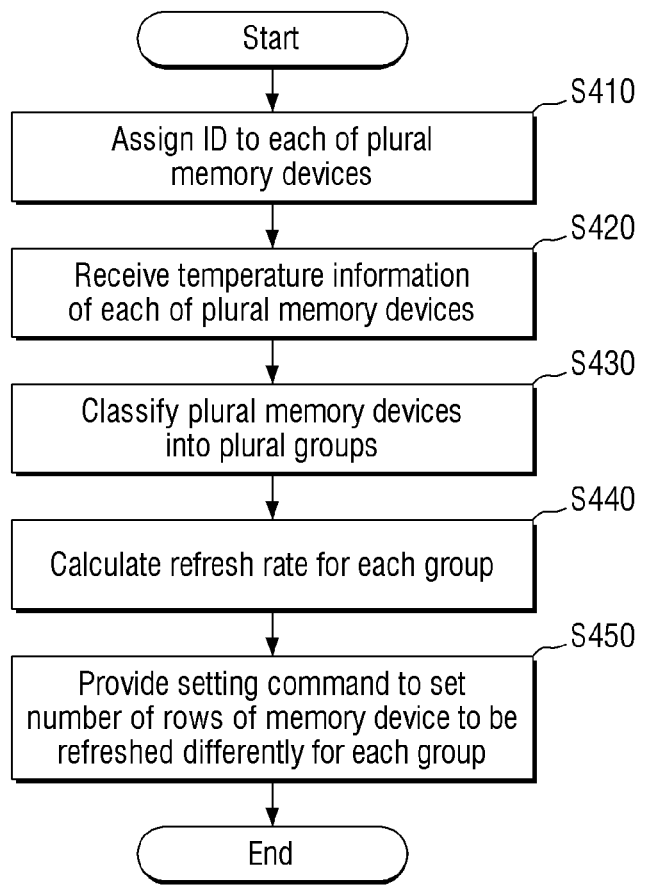
FIG. 10 is a flowchart illustrating an operating method of the storage device of FIG. 9 during booting.

An operating method of the storage device of FIG. 9 will be described with reference to FIGS. 10 and 11. FIG. 10 is a flowchart illustrating an operating method of the storage device of FIG. 9 during booting. For simplicity of description, substantially the same description as described with reference to FIGS. 1 to 9 will be omitted.

Referring to FIGS. 9 and 10, in operation S410, when booting starts, the host (200 in FIG. 1) assigns an ID to each of a plurality of volatile memory devices 150 of the storage device 100. Here, the ID refers to a unique number for identifying the plurality of volatile memory devices 150.

In operation S420, the host 200 requests temperature information from the plurality of volatile memory devices 150 and receives temperature information of each of the plurality of volatile memory devices 150.

In operation S430, the host 200 classifies the plurality of volatile memory devices 150 into a plurality of groups (e.g., G1 to G4) based on the temperature information (step S430).

For example, the plurality of volatile memory devices 150 belonging to the same temperature range may be grouped into one group by confirming which temperature range the temperature information of each of the plurality of volatile memory devices 150 belongs to.

FIG. 9 illustrates that the upper left volatile memory devices are indicated by G1, the lower left volatile memory devices are indicated by G2, the upper right volatile memory devices are indicated by G3, and the lower right volatile memory devices are indicated by G4. However, the disclosure is not limited to the groups illustrated in FIG. 9. For example, according to another example embodiment, the upper left volatile memory devices may be classified into two or more groups according to temperature information.

In operation S440, the host 200 calculates the refresh rate for each group (G1 to G4). As described in operation S330 of FIG. 3, the host 200 may use a table including a plurality of temperature ranges and refresh rates corresponding thereto. Alternatively, the host 200 may calculate the refresh rate using a preset equation using temperature information.

In operation S450, the host 200 provides a setting command to the storage device 100 to set the number of rows of the volatile memory device to be refreshed differently for each group. As described in operation S340 of FIG. 3, the setting command may be an MRS command of DDR4 or an MRW command of DDR5. As described in operation S350 of FIG. 3, the refresh rate is taken as A, the number of rows to be refreshed per refresh command when A=1 is taken as the reference row number R_a, and the refresh progress time when A=1 is taken as the reference refresh progress time tRFC_a. The refresh progress time of the volatile memory device requiring resetting of the refresh operation may be calculated as tRFC_a×A. In addition, the number of rows to be refreshed per refresh command according to the refresh rate is calculated as R_a×A.

Figure 11:
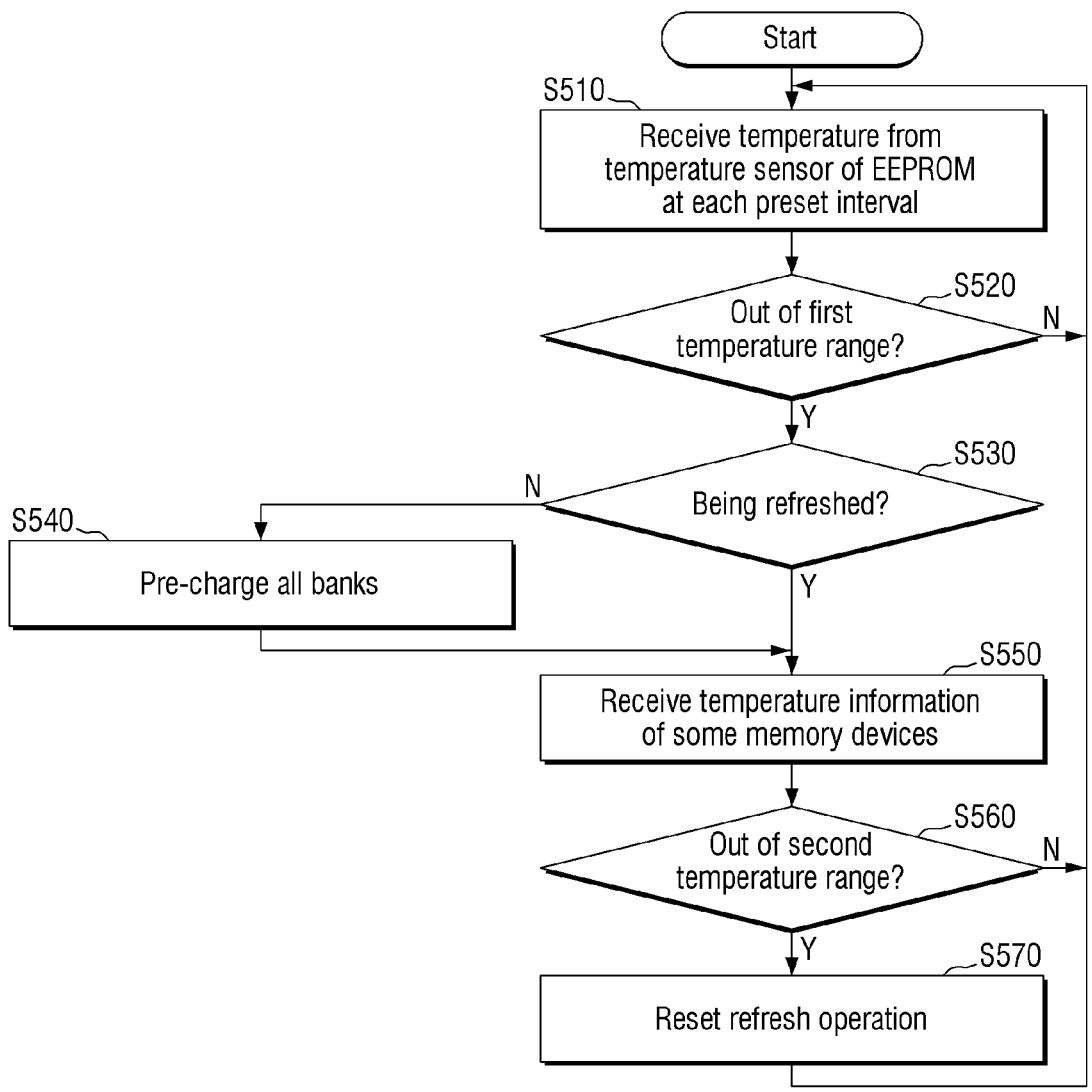
FIG. 11 is a flowchart illustrating an operating method of the storage device of FIG. 9 during run time.

FIG. 11 is a flowchart illustrating an operating method of the storage device of FIG. 9 during run time. For simplicity of description, substantially the same description as described with reference to FIGS. 1 to 10 will be omitted.

Referring to FIGS. 9 and 11, in operation S510 the host (e.g., host 200 of FIG. 1) is provided with the device temperature from a temperature sensor of a nonvolatile memory device (e.g., EEPROM) (e.g., element 135 of FIG. 9) of the storage device 100 at each preset interval. The device temperature is a temperature representing the temperature of the storage device 100, but does not represent the temperature of each of the volatile memory devices 150 included in the storage device 100.

In operation S520, it is checked whether the device temperature is out of the first temperature range. For example, when the device temperature is in the temperature range of 41 to 60° C. in the step of setting in the previous refresh operation, it is checked whether the device temperature is outside this temperature range.

When the device temperature is within the first temperature range, the process returns to operation S510.

On the other hand, when the device temperature is out of the first temperature range, operation S530 is performed, which includes checking checked whether the corresponding rank is being refreshed).

When the corresponding rank is not being refreshed, in operation S540, all banks are pre-charged and converted to an idle state.

When the corresponding rank is being refreshed, in operation S550, the host 200 receives temperature information of some volatile memory devices, not all volatile memory devices.

Here, some volatile memory devices may be two volatile memory devices corresponding to two pieces of previous temperature information that are the most different among previous temperature information of each of the plurality of volatile memory devices. Specifically, the host 200 has been provided with temperature information of all volatile memory devices in the step of setting in the previous refresh operation (e.g., in the booting operation, see S420 of FIG. 10). Accordingly, it knows which two volatile memory devices have the highest temperature/lowest temperature among all volatile memory devices. Accordingly, the host 200 receives temperature information from these two volatile memory devices.

Depending on the design, some volatile memory devices may be one volatile memory device with the highest temperature during the previous resetting.

Alternatively, some volatile memory devices may be one volatile memory device having the lowest temperature during the previous resetting.

Thereafter, in operation S560, it is checked whether the temperature information provided from some volatile memory devices is out of the corresponding second temperature range.

Specifically, it is assumed that temperature information is received from two volatile memory devices corresponding to the two pieces of previous temperature information that are the most different among previous temperature information. It is assumed that the lowest temperature is 45° C. and the highest temperature is 90° C. during the previous resetting. In the previous resetting, the volatile memory device at 45° C. has become 55° C., and in the previous resetting, the volatile memory device at 90° C. has become 97° C.

For example, 45° C. and 55° C. may belong to the same temperature range (e.g., the temperature range of 41 to 60° C.). On the other hand, 90° C. belongs to the temperature range of 85 to 95° C., but 97° C. may deviate from the temperature range of 85 to 95° C. As described above, when any one of the temperature information provided from some volatile memory devices is out of the previous temperature range (i.e., the second temperature range), it is necessary to reset the refresh operation.

Subsequently, in operation S570, the refresh operation is reset.

Specifically, the host 200 receives temperature information from all volatile memory devices (see S420 of FIG. 10). A plurality of memory devices are classified into a plurality of groups based on the temperature information (see S430 of FIG. 10). In addition, the refresh rate is newly calculated (see S440 of FIG. 10). A setting command including a refresh rate is provided to the storage device 100 (see S450 of FIG. 10). The storage device 100 sets the number of rows of the volatile memory device to be refreshed differently for each group by using the refresh rate.

Meanwhile, referring again to FIG. 9, the plurality of volatile memory devices 150 disposed on one side of the RCD 129 and the plurality of volatile memory devices 150 disposed on the other side of the RCD 129 may communicate with the host 200 through different channels. For example, the plurality of volatile memory devices 150 disposed on one side of the RCD 129 may communicate with the host 200 through a channel A, and the plurality of volatile memory devices 150 disposed on the other side of the RCD 129 may communicate with the host 200 through a channel B. Accordingly, when the refresh operation of the plurality of volatile memory devices 150 connected to the channel A is being reset by the method used in FIGS. 10 and 11, the plurality of volatile memory devices 150 connected to the channel A may perform normal operations (for example, a non-setting operation (read/write operation, or the like)).

Figure 12:
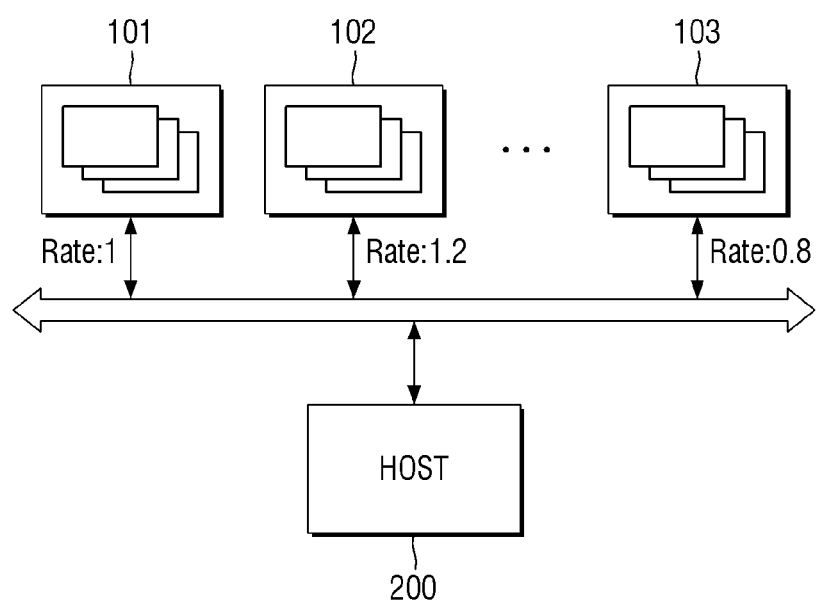
FIG. 12 is a block diagram illustrating a system according to one embodiment of the disclosure.

FIG. 12 is a block diagram illustrating a system (host-storage device system) according to an example embodiment of the disclosure.

Referring to FIG. 12, the system includes the host 200 and a plurality of storage devices 101, 102, and 103, which are connected to each other.

According to an example embodiment, temperatures of the plurality of storage devices 101, 102, and 103 may belong to different temperature ranges from each other. Specifically, each of the storage devices 101, 102, and 103 may include a temperature sensor, and temperatures measured by the temperature sensor may belong to different temperature ranges from each other. For instance, the storage device 101 may have a temperature in a first temperature range, the storage device 102 may have a temperature in a second temperature range different from the first temperature range, and the storage device 103 may have a temperature in a third temperature range different from the first temperature range and the second temperature range. The temperature sensor may be in a nonvolatile memory device (EERPOM) installed in each of the storage devices 101, 102, and 103.

Accordingly, the plurality of storage devices 101, 102, and 103 may correspond to different refresh rates from each other. For example, the refresh rate of the storage device 101 may be 1, the refresh rate of the storage device 102 may be 1.2, and the refresh rate of the storage device 103 may be 0.8.

Each of the plurality of storage devices 101, 102, and 103 corresponding to different refresh rates may have different numbers of rows to be refreshed per refresh command from each other. Alternatively, the refresh interval times may be different from each other.

When the refresh rate of the storage device 101 is B, the refresh operation of all volatile memory devices included in one storage device 101 is adjusted by the refresh rate B. That is, in all volatile memory devices included in the storage device 101, the number of rows to be refreshed per refresh command may be equally adjusted. Alternatively, refresh interval times of all volatile memory devices included in the storage device 101 may be equally adjusted to each other.

Figure 13:
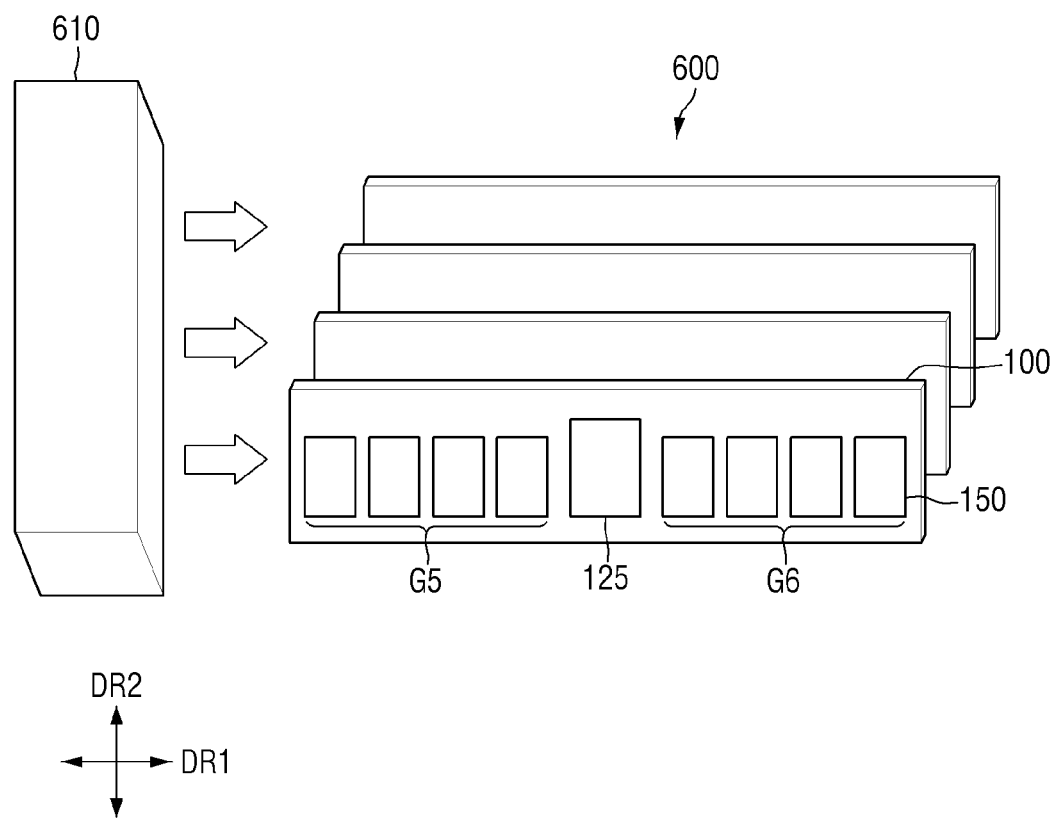
FIG. 13 is a diagram illustrating a system according to another embodiment of the disclosure.

FIG. 13 is a diagram illustrating a system according to another example embodiment of the disclosure.

Referring to FIG. 13, in the system 600 (e.g., a server system), a fan 610 for generating an air flow and at least one storage device 100 cooled by the air flow of the fan 610 are included.

As illustrated, the storage device 100 may be disposed in a first direction DR1.

As described above, the storage device 100 includes the RCD 129 and the plurality of volatile memory devices 150 disposed on both sides of the RCD 129. A group G5 is disposed on one side of the device substrate 109 and includes the plurality of volatile memory devices 150. A group G6 is disposed on the other side of the device substrate 109 and includes the plurality of volatile memory devices 150.

As illustrated, the fan 610 may form an air flow in the first direction DR1. That is, the air flow may be formed from one side direction of the device substrate of the storage device 100 to the other side direction thereof.

The group G5 is relatively close to the fan 610 compared to the group G6. That is, the group G5 may be spaced apart from the fan 610 by a first distance, and the group G6 may be spaced apart from the fan 610 by a second distance greater than the first distance. Since the group G5 is closer than the group G6, the fan 610 cools the group G5 more than the group G6. For example, a temperature difference between the group G6 and the group G5 may be about 30° C. or more.

Here, the first number of rows in the plurality of volatile memory devices 150 of the group G5 are refreshed according to the first refresh command of the host 200. On the other hand, the second number, which is greater than the first number, of rows in the plurality of volatile memory devices 150 may be refreshed according to the second refresh command of the host 200. Since the group G5 is well cooled, the number of rows to be refreshed may be reduced. Accordingly, since the group G5 has sufficient time to write/read, system performance may be improved.

In concluding the detailed description, those skilled in the art will appreciate that many variations and modifications can be made to the preferred embodiments without substantially departing from the principles of the disclosure. Therefore, the disclosed preferred embodiments are used in a generic and descriptive sense only and not for purposes of limitation.

What is claimed is:

1. An operating method of a storage device, comprising:
receiving a setting command including a first bit corresponding to a temperature range and a second bit indicating a refresh rate corresponding to the temperature range when all banks are in an idle state;

adjusting a number of rows of a volatile memory device to be refreshed based on a refresh command of a host device according to the refresh rate during an update delay time; and
after the update delay time has elapsed, receiving a non-setting command,
wherein the refresh command is determined based on a highest temperature or a lowest temperature among temperatures of a plurality of volatile memory devices in the storage device,
wherein the plurality of volatile memory devices are classified into groups based on current temperature information, and previous temperature information corresponding to the plurality of first and second volatile memory devices.

2. The operating method of claim 1, wherein the setting command further includes a third bit indicating whether to set the number of rows of the volatile memory device differently.

3. The operating method of claim 1, further comprising, before providing the setting command, providing temperature information of the volatile memory device to the host device.

4. A storage device comprising:
a plurality of first volatile memory devices, each of the plurality of first volatile memory devices having a temperature within a first temperature range;
a plurality of second volatile memory devices, each of the plurality of second volatile memory devices having a temperature within a second temperature range different from the first temperature range; and
a controller configured to refresh a first number of rows in the plurality of first volatile memory devices according to a first refresh command from a host device, and refresh a second number of rows different from the first number of rows, in the plurality of second volatile memory devices according to a second refresh command from the host device,
wherein the first refresh command is determined based on a highest temperature or a lowest temperature among the temperatures of the plurality of first volatile memory devices, or the second refresh command is determined based on a highest temperature or a lowest temperature among the temperatures of the plurality of second volatile memory devices, and
wherein the plurality of first volatile memory devices and the plurality of second volatile memory devices are classified into groups based on current temperature information, and previous temperature information corresponding to the plurality of first and second volatile memory devices.

5. The storage device of claim 4, further comprising a nonvolatile memory device including a temperature sensor configured to periodically provide a device temperature to the host device.

6. The storage device of claim 4, wherein during run time, temperature information of each of the plurality of first and second volatile memory devices is provided to the host device, and refresh rates of the plurality of first and second volatile memory devices are adjusted according to the temperature information.

7. An operating method of a storage device, comprising:
providing temperature information of one or more volatile memory devices among a plurality of volatile memory devices, but not all of the plurality of volatile memory devices, to a host device when the storage device temperature is out of a first temperature range;
providing temperature information of each of the plurality of volatile memory devices in the storage device to the host device when the temperature information of at least one of the one or more volatile memory devices is out of a second temperature range; and
receiving a setting command including a number of rows of the plurality of volatile memory devices to be refreshed differently based on the temperature information in a refresh operation of the plurality of volatile memory devices from the host device,
wherein the plurality of volatile memory devices are classified into groups based on temperature information,
wherein the setting command indicates the of rows of the plurality of volatile memory devices to be refreshed differently for each of the groups based on the temperature information, and
wherein the plurality of volatile memory devices are classified into groups after the temperature information is obtained,
wherein the plurality of volatile memory devices comprises three or more volatile memory devices, and
wherein the one or more volatile memory devices includes two volatile memory devices corresponding to two pieces of temperature information having a largest difference among the temperature information of each of the plurality of volatile memory devices.

8. The operating method of claim 7, wherein the setting command includes a first bit indicating a refresh rate corresponding to a temperature range.

9. The operating method of claim 8, wherein the setting command further includes a second bit indicating a temperature range corresponding to the volatile memory device.

10. The operating method of claim 8, wherein the setting command further includes a third bit indicating whether to set the number of rows of the volatile memory device for each group differently.

11. The operating method of claim 7, wherein the storage device further includes a nonvolatile memory device including a temperature sensor, and
wherein the operating method further comprising, before providing the temperature information of each of the plurality of volatile memory devices to the host device, providing a device temperature obtained by the temperature sensor to the host device.

12. The operating method of claim 11, further comprising, between the providing of the temperature information of each of the plurality of volatile memory devices to the host device and the providing of the device temperature of the temperature sensor to the host device, providing temperature information of one or more volatile memory devices among the plurality of volatile memory devices to the host device.

13. The operating method of claim 7, further comprising, after receiving the setting command and after an update delay time has elapsed, receiving a non-setting command.

14. The operating method of claim 7, wherein the plurality of volatile memory devices comprises a plurality of first volatile memory devices connected to a first channel, and a plurality of second volatile memory devices connected to a second channel independent of the first channel, and
while the plurality of first volatile memory devices connected to the first channel are performing a reset operation according to the setting command, the plurality of second volatile memory devices connected to the second channel perform a non-setting operation.

15. The operating method of claim 7, wherein the temperature information of each of the plurality of volatile memory devices are obtained by separate temperature sensors.

16. The operating method of claim 7, wherein the refresh operation of the plurality of volatile memory devices is determined based on a highest temperature or a lowest temperature among the temperature information of the plurality of volatile memory devices.

17. An operating method of a host device, comprising:
receiving temperature information of one or more volatile memory devices among a plurality of volatile memory devices of a storage device, but not all of the plurality of volatile memory devices, when the storage device temperature is out of a first temperature range;
receiving temperature information of each of the plurality of volatile memory devices of the storage device when the temperature information of at least one of the one or more volatile memory devices is out of a second temperature range;
classifying the plurality of volatile memory devices into a plurality of groups based on the temperature information of each of the plurality of volatile memory devices; and
providing a setting command including a number of rows of the plurality of volatile memory devices to be refreshed differently based on the temperature information in a refresh operation of the plurality of volatile memory devices to the storage device,
wherein the setting command indicates the number of rows of the plurality of volatile memory devices to be refreshed differently for each of the plurality of groups based on the temperature information, and
wherein the plurality of volatile memory devices are classified into groups after the temperature information is obtained,
wherein the plurality of volatile memory devices comprises three or more volatile memory devices, and
wherein the one or more volatile memory devices includes two volatile memory devices corresponding to two pieces of temperature information having a largest difference among the temperature information of each of the plurality of volatile memory devices.

18. The operating method of claim 17, wherein the setting command includes a bit indicating a refresh rate corresponding to a temperature range.

19. The operating method of claim 17, wherein the storage device further includes a nonvolatile memory device including a temperature sensor,
the operating method further comprising, before receiving the temperature information of each of the plurality of volatile memory devices to the host device, receiving a device temperature of the temperature sensor.

20. The operating method of claim 17, further comprising:
differently setting a refresh interval time for each group, among the plurality of groups; and
providing a refresh command to the storage device according to the refresh interval time.

21. A system comprising:
a fan configured to generate an air flow; and
a storage device cooled by the air flow of the fan,
wherein the storage device includes:
a device substrate;
a plurality of first volatile memory devices disposed on a first side of the device substrate;
a plurality of second volatile memory devices disposed on a second side of the device substrate; and
a controller configured to refresh a first number of rows in the plurality of first volatile memory devices according to a first refresh command from a host device, and refresh a second number of rows different from the first number of rows, in the plurality of second volatile memory devices according to a second refresh command from the host device,
wherein the first refresh command is determined based on a highest temperature or a lowest temperature among the temperatures of the plurality of first volatile memory devices, or the second refresh command is determined based on a highest temperature or a lowest temperature among the temperatures of the plurality of second volatile memory devices, and
wherein the plurality of first volatile memory devices and the plurality of second volatile memory devices are classified into groups based on current temperature information, and previous temperature information corresponding to the plurality of first and second volatile memory devices.

22. The system of claim 21, wherein the plurality of first volatile memory devices are spaced apart from the fan by a first distance, and the plurality of second volatile memory devices are spaced apart from the fan by a second distance greater than the first distance.

23. The system of claim 21, wherein the air flow of the fan is from the first side to the second side of the device substrate.

24. The system of claim 21, wherein a first temperature of each of the plurality of first volatile memory devices is within a first temperature range, and a second temperature of each of the plurality of second volatile memory devices is within a second temperature range different from the first temperature range.

25. The system of claim 21, wherein the storage device further includes a nonvolatile memory device including a temperature sensor configured to periodically provide a device temperature to the host device.

26. A semiconductor device comprising:
a plurality of volatile memory devices, each comprising a plurality of volatile memory cells arranged in a plurality of rows; and
a memory controller configured to:
provide temperature information of one or more volatile memory devices among the plurality of volatile memory devices, but not all of the plurality of volatile memory devices, to a host device when the semiconductor device temperature is out of a first temperature range;
provide temperature information of each of the plurality of volatile memory devices in the semiconductor device to the host device when the temperature information of at least one of the one or more volatile memory devices is out of a second temperature range; and
receive a setting command including a number of rows of the plurality of volatile memory devices to be refreshed differently based on the temperature information in a refresh operation of the plurality of volatile memory devices from the host device,
wherein the plurality of volatile memory devices comprises three or more volatile memory devices, and wherein the one or more volatile memory devices includes two volatile memory devices corresponding to two pieces of temperature information having a largest difference among the temperature information of each of the plurality of volatile memory devices.

* * * * *